United States Patent
Yoshizawa

[11] Patent Number: 5,909,474
[45] Date of Patent: Jun. 1, 1999

[54] PHASE-LOCKED LOOP SYSTEM

[75] Inventor: Akihiko Yoshizawa, Yokohama, Japan

[73] Assignee: Kabushiki Kaisha Toshiba, Kawasaki, Japan

[21] Appl. No.: 08/768,633

[22] Filed: Dec. 18, 1996

[30] Foreign Application Priority Data

Dec. 19, 1995 [JP] Japan ............... 7-330424

[51] Int. Cl.⁶ ............... H03D 3/24
[52] U.S. Cl. ............... 375/376; 327/156; 331/2; 331/18; 331/25
[58] Field of Search ............... 375/376, 327; 331/2, 18, 17, 1 R, 25, 187, 108 R; 455/260; 327/147, 156

[56] References Cited

U.S. PATENT DOCUMENTS

| | | | |
|---|---|---|---|
| 5,038,115 | 8/1991 | Myers et al. | 331/2 |
| 5,072,195 | 12/1991 | Graham et al. | 331/2 |
| 5,302,919 | 4/1994 | Abe | 331/2 |
| 5,374,904 | 12/1994 | Ishibashi | 331/17 |
| 5,382,922 | 1/1995 | Gersbach et al. | 331/1 A |
| 5,414,390 | 5/1995 | Kovacs et al. | 331/2 |
| 5,559,473 | 9/1996 | Anderson et al. | 331/17 |
| 5,579,184 | 11/1996 | Nakanishi et al. | 360/51 |
| 5,657,359 | 8/1997 | Sakae et al. | 375/376 |
| 5,734,301 | 3/1998 | Lee et al. | 375/376 |

*Primary Examiner*—Stephen Chin
*Assistant Examiner*—Betsy L. Deppe
*Attorney, Agent, or Firm*—Oblon, Spivak, McClelland, Maier & Neustadt, P.C.

[57] ABSTRACT

A phase-locked loop (PLL) system including a voltage-controlled oscillator, a divider, a phase detector, and a low-pass filter. The voltage-controlled oscillator has two control input terminals S and L and generates a pulse signal having an oscillation frequency fout2. The divider generates a pulse signal having a frequency fout2/N2 from the output signal of the oscillator. The phase detector detects the phase difference between the pulse signal output from the divider and the a pulse signal having a reference frequency fref and generates an error signal corresponding to the phase difference detected. The low-pass filter integrates the error signal. The output signal of the low-pass filter is input to the control input terminal S of the oscillator. A control signal is input to the control input terminal L of the oscillator to control the free-running frequency of the oscillator.

12 Claims, 8 Drawing Sheets

PHASE-LOCKED LOOP SYSTEM

BACKGROUND OF THE INVENTION

The present invention relates to a phase-locked loop (PLL) circuit, and more particularly to a PLL circuit which exhibits a large multiplication ratio to the reference frequency and low-jitter characteristic or high output-frequency stability and which is therefore suitable for use in a monitor control IC.

Figure 1:
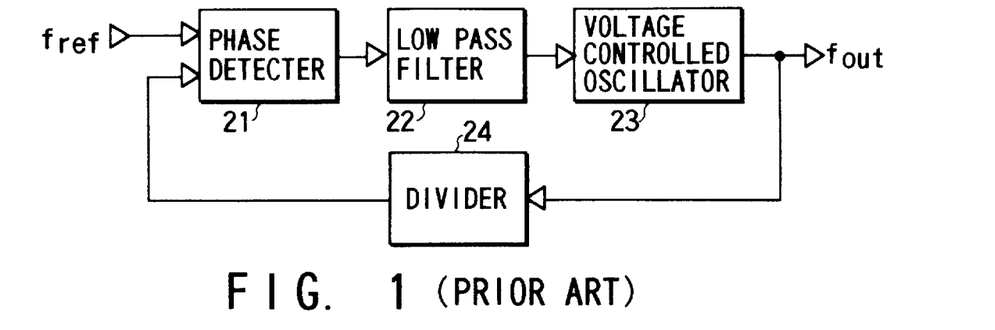
FIG. 1 is a block diagram of a conventional PLL circuit.

FIG. 1 shows a conventional PLL circuit. As seen from FIG. 1, the PLL circuit comprises a phase detector 21, a low-pass filter 22, a voltage-controlled oscillator 23, and a divider 24.

A pulse signal having a reference frequency fref is supplied to one of the input terminals of the phase detector 21. Supplied to the other input terminal of the phase detector 21 is a pulse signal output from the divider 24 and having a frequency fout/N. The divider 24 can divide the oscillation frequency fout of the voltage-controlled oscillator 23 by N, thereby generating the frequency fout/N.

The phase detector 21 detect the phase difference between the pulse signal having the reference frequency fref and the pulse signal having the frequency fout/N. It then generates a signal which corresponds to the phase difference detected When the frequency fout/N is lower than the reference frequency fref, the pulse signal having the frequency fout/N has a pulse width greater than that of the pulse signal which has the reference frequency fref. In this case, the phase detector 21 outputs a low-level signal which lasts for a period corresponding to the pulse-width difference between the pulse signals input the detector 21. The low-level signal is supplied to the low-pass filter 22, which integrates the low-level signal and supplies it to the voltage-controlled oscillator 23. The output signal of the low-pass filter 22 is at a level higher than the low-level signal generated by the phase detector 21. As a result, the oscillator 23 outputs a pulse signal which has a higher frequency than the output signal of the low-pass filter 22.

The output signal of the voltage-controlled oscillator 23 is supplied to the phase detector 21 through the divider 24. The divider 24 compares this signal with the pulse signal having the reference frequency fref in terms of frequency. The frequency fout/N of the signal may be lower than the reference frequency fref. If so, the sequence of steps described is repeated until the frequency fout/N becomes equal to the reference frequency fref.

When the frequency fout/N is conversely lower than the reference frequency fref, the pulse signal having the frequency fout/N has a pulse width less than that of the pulse signal which has the reference frequency fref. In this case, the phase detector 21 outputs a high-level signal which lasts for a period corresponding to the pulse-width difference between the pulse signals input the detector 21. The low-level signal is supplied to the low-pass filter 22, which integrates the high-level signal and supplies it to the voltage-controlled oscillator 23. Thus, the output signal of the low-pass filter 22 is at a level lower than the low-level signal generated by the phase detector 21. Hence, the oscillator 23 outputs a pulse signal which has a lower frequency than the output signal of the low-pass filter 22.

As mentioned above, the PLL circuit keeps comparing two pulse signals having a frequency fout/N and the reference frequency fref and operates to eliminate the phase difference between the pulse signals compared.

When the phase difference between the pulse signals compared decreases to zero, the output signal of the phase detector 21 acquires a high impedance. The level of the output signal of the detector 21 no longer changes. Thus, the oscillation frequency of the voltage-controlled oscillator 23 no longer changes.

The output frequency fout of the PLL circuit is determined by the reference frequency fref and the division number N, as is given below:

$$\text{fout} = \text{fref} \times N \quad (1)$$

That is, the output frequency fout is N times the reference frequency fref, where N is an integer. The division number N can be varied, and so can be the output frequency fout, if the divider 24 is constituted by a programmable counter.

Here arises a problem. Generally, the output signal of the phase detector 21 is generated at either the leading edge of the pulse signal having the reference frequency fref or the trailing edge thereof. The greater the multiplication ratio of the output frequency fout with respect to the reference frequency fref, the longer the intervals at which the phase detector 21 generated signals. Consequently, phase control cannot be fully accomplished in the PLL circuit, inevitably reducing the stability of the output frequency fout.

The output-frequency stability of a PLL circuit is evaluated on the basis phase errors and jitter. A phase error is the phase difference between the output signal having the output frequency fout and the reference pulse signal having the reference frequency fref. Jitter is fluctuations in the output frequency fout.

Generally, in a PLL circuit the phase error decreases, but the jitter increases, when the amplitude of the output signal of low-pass filter is increased. Conversely, the jitter decreases, but the phase error increases when the amplitude of the output signal of the low-pass filter is decreased.

Figure 2:
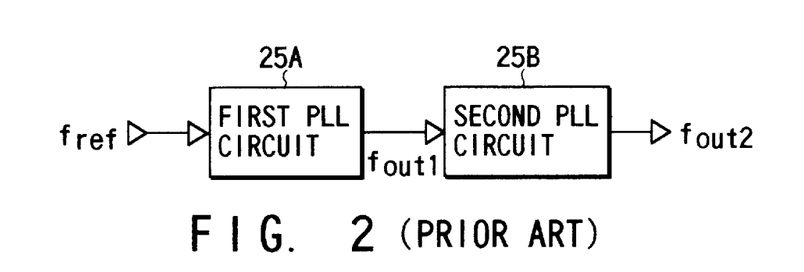
FIG. 2 is a block diagram of a conventional PLL system.

FIG. 2 illustrates a conventional PLL system designed to reduce the jitter As shown in FIG. 2, the PLL system comprises two PLL circuits 25A and 25B which are identical to the PLL circuit illustrated in FIG. 1.

In operation, a pulse signal having a reference frequency fref is input to the first PLL circuit 25A. The first PLL circuit 25A incorporates a divider which has a division number N1. The first PLL circuit 25A generates a pulse signal having a frequency fout1 which is N1 times the reference frequency fref (i.e., fref×N1). The output signal of the first PLL circuit 35A, i.e., a pulse signal having the frequency fout1, is input to the second PLL circuit 25B. The second PLL circuit 25B incorporates a divider which has a division number N2. The second PLL circuit 25B generates a pulse signal having a frequency fout2 which is N2 times the frequency fout1, or N1 times N2 times the reference frequency fref (i.e., fref×N1×N2).

In the PLL systems each PLL circuit has a multiplication ratio of only about 10. The phase error and jitter are therefore much less in this PLL system than in the PLL circuit illustrated in FIG. 1. The PLL system finds frequent use in monitor control ICs. This is because a monitor control IC is designed to output a signal whose oscillation frequency is several hundred times as high as the frequency of a horizontal sync signal (i.e., reference frequency).

In most PLL circuits, the greater the multiplication ratio of the output frequency with respect to the reference frequency, the lower the oscillation-frequency stability, and the more prominent the phase error and the jitter. Hence, with the PLL system of the type shown in FIG. 2 which has two PLL circuits, the oscillation-frequency stability can be enhanced by decreasing the multiplication ratio of one of the PLL circuits.

In the second PLL circuit 26B shown in FIG. 2, however, the multiplication ratio is indeed low, but the reference frequency (i.e., the frequency fout1 of the pulse signal output from the first PLL circuit 35A) fluctuates inevitably because of the jitter in the first PLL circuit 35A. If the jitter in the first PLL circuit 35A is large, the oscillation-frequency stability cannot be enhanced even if the multiplication ratio of one PLL circuit is decreased. To be more specific, since the multiplication ratio of the first PLL circuit 25A cannot be increased, the multiplication ratio of the second PLL circuit 25B unavoidably increases. As a consequence, no improvement can be achieved in the oscillation-frequency stability of the PLL system.

In order to enhance the oscillation-frequency stability of each PLL circuit, it is necessary to minimize the conversion coefficient of the voltage-controlled oscillator (ice., the ratio of the change in oscillation frequency to the change in control voltage).

If the conversion coefficient of the oscillator is small, the output frequency of the oscillator will change far less than does the control voltage thereof. Even if the control voltage changes due to, for example, noise, the output frequency will change but very little. The output-frequency stability of each PLL circuit will therefore increase. However, the lock range will be reduced, and the use of the PLL circuit will be considerably limited.

On the other hand, if the conversion coefficient of the oscillator is large, the output frequency of the oscillator will change far more than does the control voltage of thereof. If the conversion coefficient is increased, it will be possible to provide a broad lock range, whereby the PLL circuit can be put to various uses. If the voltage-controlled oscillator has a large conversion coefficient, however, the output frequency of the PLL circuit will greatly change when the control voltage changes only a little due to noise or the like. As a result, the output-frequency stability of each PLL circuit will decrease.

In the case where a PLL circuit is built in an IC chip, the PLL circuit is designed to have a lock range which is two to three times the minimum value required, so that it may actually have a sufficient lock range despite the process variation. In practice, it would therefore be difficult to decrease the conversion coefficient of the voltage-control oscillator.

BRIEF SUMMARY OF THE INVENTION

The present invention has been made to solve the above-mentioned problem inherent to the conventional PLL circuits. The object of the invention is to generate a pule signal having a high, stable, low-jitter oscillation frequency, by using a voltage-controlled oscillator having a small conversion coefficient in a PLL circuit and by narrowing the lock range of the PLL circuit, even if the PLL circuit has a large multiplication ratio, so that the PLL circuit may generate a pulse signal having a broad-band frequency despite the narrow lock range and may therefore be put to various uses.

To attain the object mentioned above, a PLL system according to the invention comprises a first voltage-controlled oscillator having first and second control input terminals, for generating a pulse signal having an oscillation frequency fout2; a first divider for generating a pulse signal having a frequency fout2/N2 from the pulse signal generated by the first voltage-controlled oscillator and having the oscillation frequency fout2; a first phase detector for detecting a phase difference between the pulse signal generated by the first divider and a pulse signal having a reference frequency fref and generating an error signal corresponding to the phase difference; and a first low-pass filter for integrating the error signal generated by the first phase detector.

A control signal is supplied to the first control input terminal of the first voltage-controlled oscillator to control a free-running frequency of the first voltage-controlled oscillator, and an output signal of the first low-pass filter is supplied to the second control input terminal of the first voltage-controlled oscillator.

The PLL system may further comprises: a second voltage-controlled oscillator having first and second control input terminals, for generating a pulse signal having an oscillation frequency fout1; a second divider for generating a pulse signal having a frequency fout1/N1 from the pulse signal generated by the second voltage-controlled oscillator and having the oscillation frequency fout1; a second phase detector for detecting a phase difference between the pulse signal generated by the second divider and a pulse signal having a reference frequency fxo and generating an error signal corresponding to the phase difference; and a second low-pass filter for integrating the error signal generated by the second phase detector.

In this case, an output signal of the second low-pass filter is supplied to the first control input terminal of the first voltage-controlled oscillator and also to the first control input terminal of the second voltage-controlled oscillator, and a reference voltage is applied to the second control input terminal of the second voltage-controlled oscillator.

Alternatively, the PLL system may further comprises: a second divider for generating a pulse signal having a frequency fxo/N1, where fxo is a second reference frequency; a second voltage-controlled oscillator having first and second control input terminals, for generating a pulse signal having an oscillation frequency fout1; a second phase detector for detecting a phase difference between the pulse signal generated by the second divider and the pulse signal generated by the second voltage-controlled oscillator and generating an error signal corresponding to the phase difference; and a second low-pass filter for integrating the error signal generated by the second phase detector.

In this case, an output signal of the second low-pass filter is supplied to the first control input terminal of the first voltage-controlled oscillator and also to the first control input terminal of the second voltage-controlled oscillator, and a reference voltage is applied to the second control input terminal of the second voltage-controlled oscillator Still alternatively the PLL system may further comprises: a second voltage-controlled oscillator having first and second control input terminals, for generating a pulse signal having an oscillation frequency fout1; a second phase detector for detecting a phase difference between the pulse signal generated by the second voltage-controlled oscillator and a pulse signal having a reference frequency fxo and generating an error signal corresponding to the phase difference; and a second low-pass filter for integrating the error signal generated by the second phase detector, wherein an output signal of the second low-pass filter is supplied to the first control input terminal of the first voltage-controlled oscillator and also to the first control input terminal of the second voltage-controlled oscillator, and a reference voltage is applied to the second control input terminal of the second voltage-controlled oscillator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

PLL system according to the present invention will be described in detail, with reference to the accompanying drawings.

Figure 3:
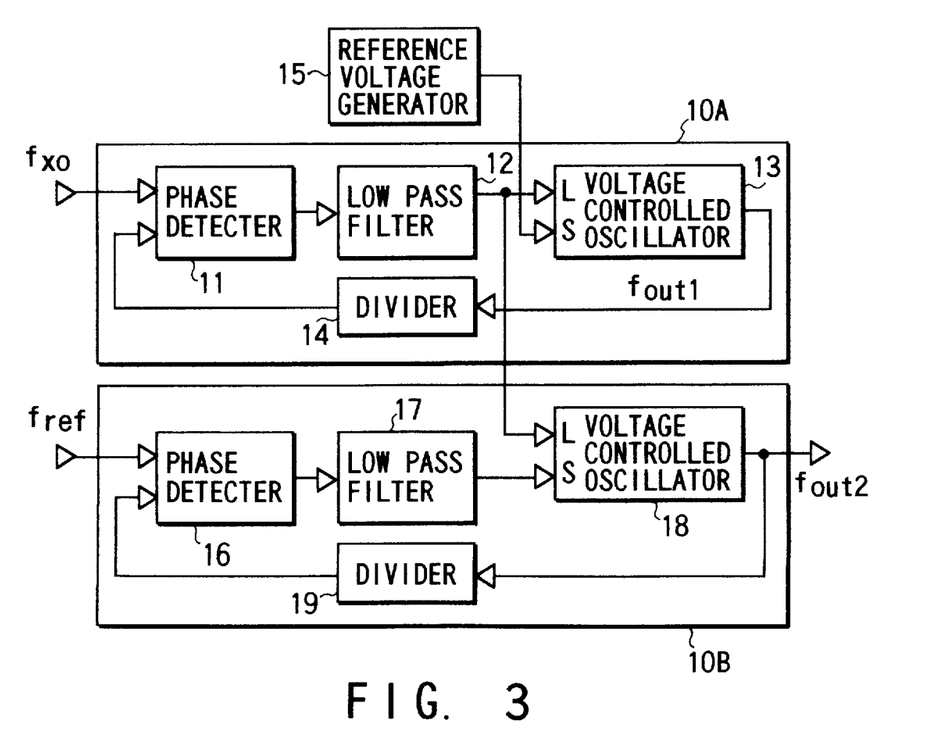
FIG. 3 is a block diagram of a PLL system according to a first embodiment of the present invention.

FIG. 3 shows a PLL system according to the first embodiment of this invention. The PLL system comprises a first PLL circuit 10A, a second PLL circuit 10B, and a reference voltage generator 15.

The first PLL circuit 10A comprises a phase detector 11 a low-pass filter 12, a voltage-controlled oscillator 13, and a divider 14. Similarly, the second PLL circuit 10B comprises a phase detector 16, a low-pass filter 17, a voltage-controlled oscillator 18, and a divider 19. The voltage-controlled oscillators 13 and 19 have two input terminals L and S each. A control signal supplied to the input terminal L of each oscillator controls the broad-band oscillation frequency of the oscillator. A control signal supplied to the input terminal S of the oscillator controls the narrow-band oscillation frequency of the oscillator.

A pulse signal generated by a crystal and having a frequency fxo is input to the first PLL circuit 10A. In the first PLL circuit 10A, the phase detector 11 detects the phase difference between the pulse signal having the frequency fxo and a pulse signal having a frequency fout1/N1. The phase detector 11 generates a signal which corresponds to the phase difference detected.

The divider 14 divides the frequency fout1 of the output signal of the voltage-controlled oscillator 13 by N1, where N1 is an integer, generating a pulse signal which has a frequency fout1/N1. The low-pass filter 12 integrates the pulse signal output from the phase detector 11. The output signal of the low-pass filter 12 is supplied to the input terminal L of the voltage-controlled oscillator 12, so as to be converted into a pulse signal having a predetermined frequency on the basis of a large conversion coefficient K (=oscillation frequency $\Delta f$/input voltage $\Delta V$). The input terminal S of the oscillator 12 to which a pulse signal is supplied to be converted into a pulse signal having a predetermined frequency on the basis of a small conversion coefficient K is connected to the reference voltage generator 15 which generates a reference voltage (VDD/2).

A pulse signal having a reference frequency fref is input to the second PLL circuit 10B. In the second PLL circuit 10A, the divider 19 divides the frequency of the pulse signal output from the voltage-controlled oscillator 18 and having a frequency fout2 by N2, thus generating a pulse signal having a frequency fout2/N2. The output pulse signal of the divider 19 is supplied to the phase detector 16. The phase detector 16 detects the phase difference between the output pulse signal of the divider 16 and the pulse signal having the reference frequency fref. The phase detector 16 generates a signal which corresponds to this phase difference detected.

The low-pass filter 17 integrates the pulse signal output from the phase detector 16. The output signal of the low-pass filter 17 is supplied to the input terminal S of the voltage-controlled oscillator 18, so as to be converted into a pulse signal having a predetermined frequency on the basis of a small conversion coefficient K (=oscillation frequency $\Delta f$/input voltage $\Delta V$). The input terminal L of the oscillator 18 to which a pulse signal is supplied to be converted into a pulse signal having a predetermined frequency on the basis of a large conversion coefficient K is connected to the output terminal of the low-pass filter 12 of the first PLL circuit 10A.

Figure 4A:
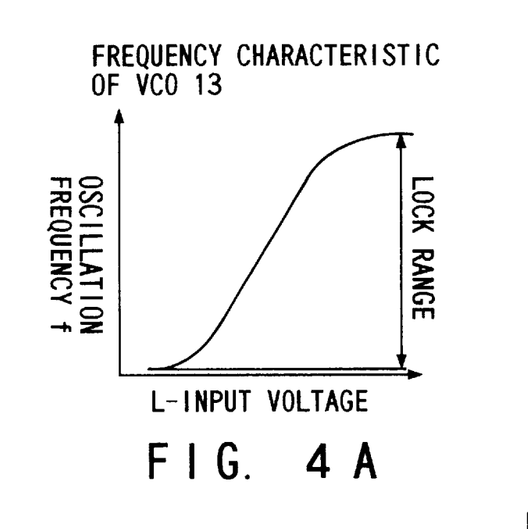
FIG. 4A is a graph representing the relationship between the L input voltage and output frequency f of the voltage-controlled oscillator incorporated in the PLL system shown in FIG. 3.
Figure 4B:
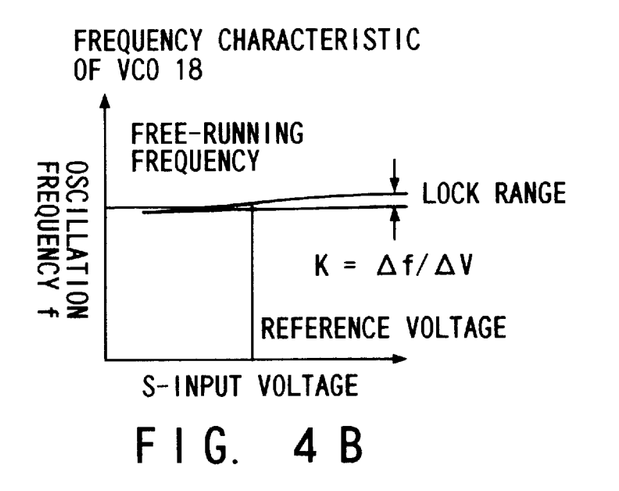
FIG. 4B is a graph representing the relationship between the S input voltage and output frequency f of the voltage-controlled oscillator.

FIG. 4A represents the frequency characteristic (or output characteristic) of the voltage-controlled oscillator 13 shown in FIG. 3, and FIG. 4B the frequency characteristic (or output characteristic) of the voltage-controlled oscillator 18 shown in FIG. 3.

In the first PLL circuit 10A, the output signal of the low-pass filter 12 is supplied to the input terminal L of the voltage-controlled oscillator 13. Thus, the voltage input to the terminal L is converted into a pulse signal of a predetermined frequency, by a large conversion coefficient. The phase error and jitter of the output pulse signal having the frequency fout1 can be much reduced if the multiplication ratio N1 of the output frequency fout1 with respect to the reference frequency fxo is set at a small value ranging from 1 to 3.

In the second PLL circuit 10B, the output signal of the low-pass filter 12 of the first PLL circuit 10A is supplied to the input terminal L of the voltage-controlled oscillator 18. When the element of the voltage-controlled oscillator 13 is identical to the element of the voltage-controlled oscillator 18, the output frequency (or free-running frequency) fout2 of the voltage-controlled oscillator 18 is therefore equal to the output frequency fout1 of the voltage-controlled oscillator 13 of the first PLL circuit 10A. Hence, the phase error and jitter of the output pulse signal having the frequency fout2 can be much reduced, like the output signal of the voltage-controlled oscillator 13 of the first PLL circuit 10A.

The output frequency fout1 of the voltage-controlled oscillator 13 is fxo×N1, which is not influenced by the process variation of the first PLL circuit 10A, the power-supply voltage thereof, the ambient temperature, or the like. Even if the voltage-controlled oscillator 18 has a very narrow lock ranges the second PLL circuit 103 would not be unlocked and would keep operating with high stability Since the voltage-controlled oscillator 18 can have a narrow lock range, its output frequency fout2 is not influenced by noise Thus, both the phase error and the jitter can be reduced even if the multiplication ratio of the second voltage-controlled oscillator 18 is set at about 100.

As described above, the free-running frequency (=fxo× N1) of the first PLL circuit 10A is determined by the reference frequency fxo and the division number N1 of the divider 12. This enables the second PLL circuit 10B to operate within a narrow lock range. Hence, the PLL system can generate an output signal having a low-jitter, highly stable frequency even if the second PLL circuit 10B has a multiplication ratio of several hundred.

Figure 5:
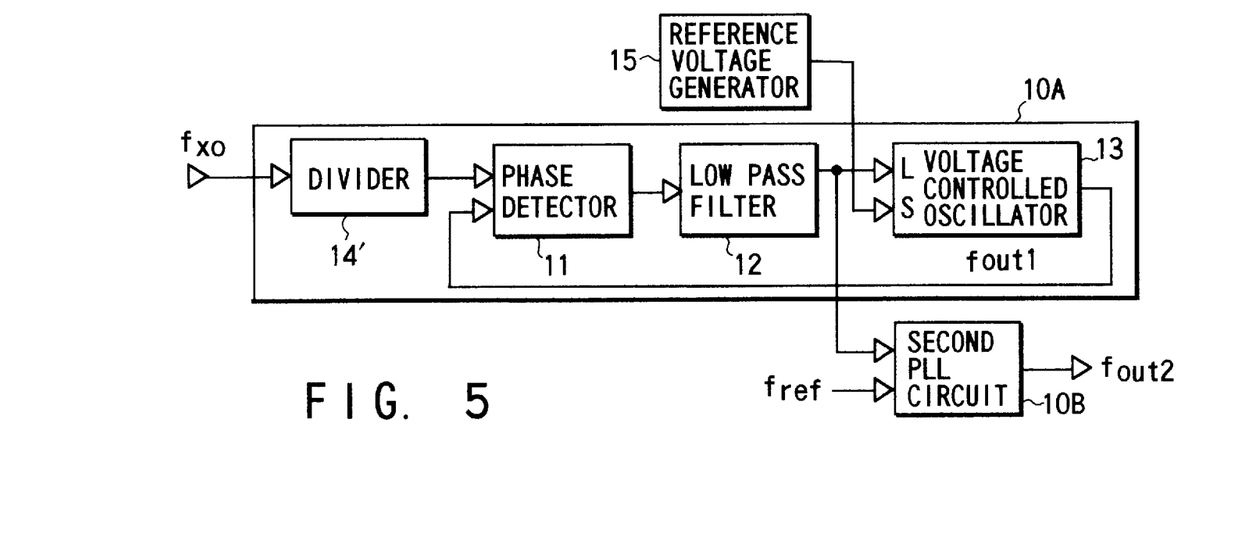
FIG. 5 is a block diagram of a PLL system according to a second embodiment of the invention.

FIG. 5 illustrates a PLL system according to the second embodiment of the invention. The second embodiment is different from the first embodiment (FIG. 3) in respect of the structure of the first PLL circuit 10A. It is identical to the first embodiment in respect of the structure of the second PLL circuit 10B.

In the first PLL circuit 10A, the phase detector 11 detects the phase difference between the pulse signal output from the divider 14' and the pulse signal output the voltage-controlled oscillator 13. The phase detector 11 generates a pulse signal which corresponds to the phase difference detected. The divider 14' receives a signal generated by a crystal and having a frequency fxo and divides the frequency fxo by N1, generating a signal having a frequency fxo/N1.

The output signal of the phase detector 11 is input to the low-pass filter 12, which integrates the input signal. The output signal of the low-pass filter 12 is supplied to the input terminal L of the voltage-controlled oscillator 12, so as to be converted into a pulse signal having a predetermined frequency on the basis of a large conversion coefficient K (=oscillation frequency Δf/input voltage ΔV). The input terminal S of the oscillator 12 to which a pulse signal is supplied to be converted into a pulse signal having a predetermined frequency on the basis of a small conversion coefficient K is connected to the reference voltage generator 15 which generates a reference voltage (VDD/2).

The PLL system shown in FIG. 5 is useful when the reference frequency fxo is higher than the free-running frequency of the second PLL circuit 10B. This is because the load on the phase detector 11 is reduced since the divider 14' converts the pulse signal having the reference frequency fxo into a pulse signal having a frequency fxo/N1.

Figure 6:
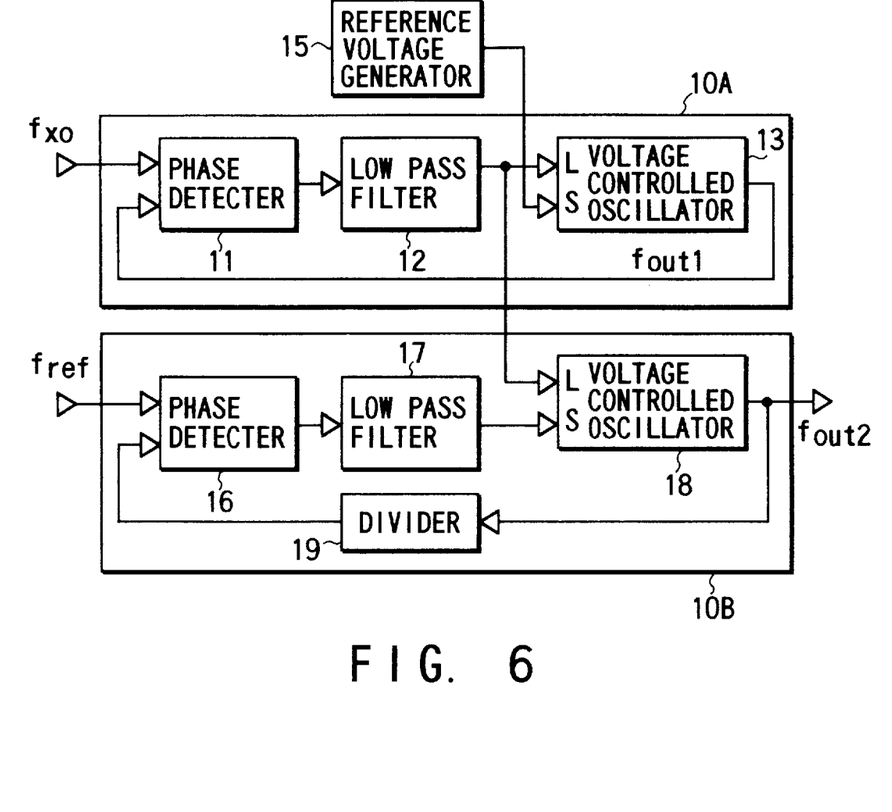
FIG. 6 is a block diagram of a PLL system according to a third embodiment of the invention.

FIG. 6 shows a PLL system according to the third embodiment of the present invention. In the third embodiment, the free-running frequency of the second PLL circuit 10B is based on the conversion coefficient at the input terminal L of the voltage-controlled oscillator 13 and the conversion coefficient at the input terminal L of the voltage-controlled oscillator 18. Hence, the first PLL circuit 10A has no divider at all.

In the third embodiment, the conversion-coefficient ratio RK is set as follows:

$$RK = KVCO2/KVCO1 \quad (2)$$

where KVCO1 is the conversion coefficient at the input terminal L of the voltage-controlled oscillator 13, and KVCO2 is the conversion coefficient at the input terminal L of the voltage-controlled oscillator 18.

In the third embodiment, the free-running frequency of the second PLL circuit 10B is given as: fxo×RK.

The PLL system shown in FIG. 6 generates a signal having less jitter and a higher frequency than does the first and second embodiment. This is because the first PLL circuit 10A has no divider, while the first PLL circuit of the first and second embodiments has a divider.

A divider having a division number N1 may be incorporated into the first PLL circuit 10A, nonetheless, thereby to set the free-running frequency of the second PLL circuit 10B at the value of fxo×RK×N1.

Figure 7A:
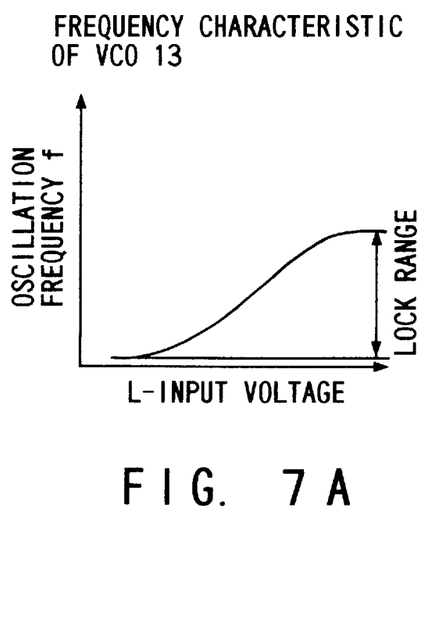
FIG. 7A is a graph illustrating the frequency characteristic of the voltage-controlled oscillator 13 used in the PLL system shown in FIG. 6.
Figure 7B:
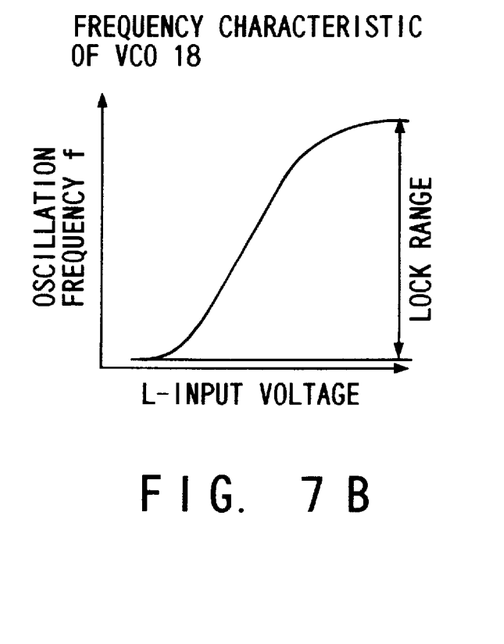
FIG. 7B is a graph illustrating the frequency characteristic of the voltage-controlled oscillator 18 used in the PLL system shown in FIG. 6.

FIG. 7A illustrates the frequency characteristic of the voltage-controlled oscillator 13. FIG. 7B shows the frequency characteristic of the voltage-controlled oscillator 18.

Figure 8:
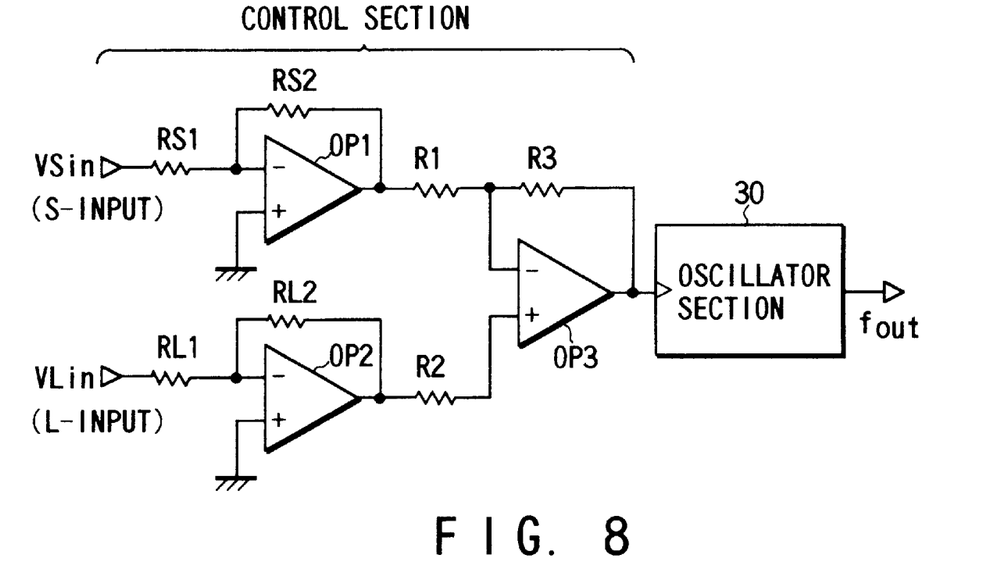
FIG. 8 is a diagram showing a first example of a control section for use in a voltage-controlled oscillator.

FIG. 8 illustrates a first example of the control section for use in a voltage-controlled oscillator which has two input terminals. As shown in FIG. 8, the control section comprises three operational amplifiers OP1 to OP3 and seven resistors RS1 RS2, RL1, RL2 and R1 to R3. The conversion coefficient at the input terminal S is determined by changing the resistance ratio among the resistors RS1, RS2, R1 and R3 and changing the input gain. Similarly, the conversion coefficient at the input terminal L is determined by changing the resistance ratio among the resistors RL1, RL2 and R2 and changing the input gain.

Figure 9:
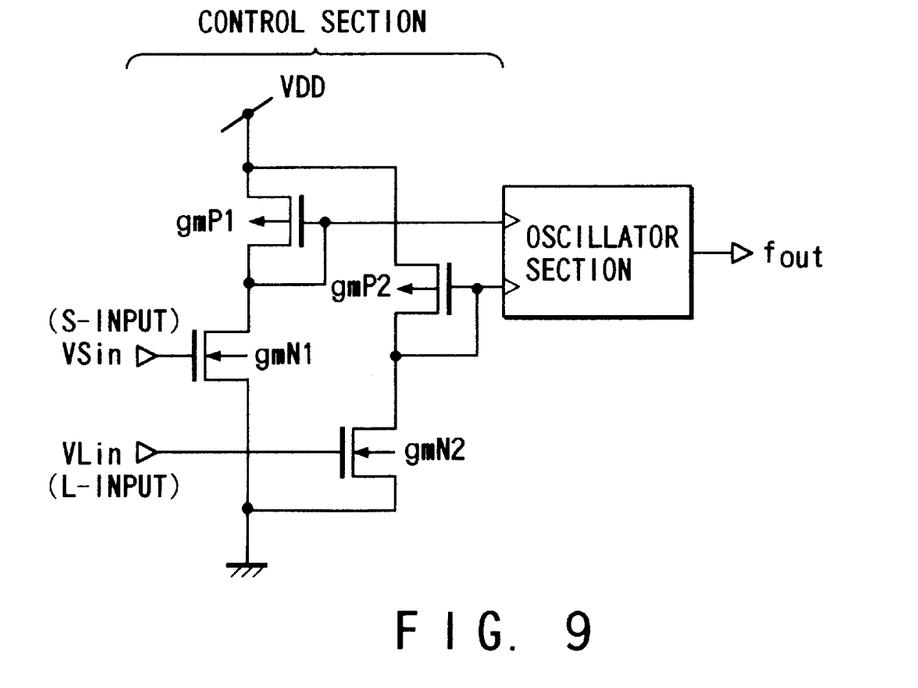
FIG. 9 is a diagram showing a second example of a control section for use in a voltage-controlled oscillator.

FIG. 9 shows a second example of the control section for use in a voltage-controlled oscillator which has two input terminals. As seen from FIG. 9, the control section comprises two P-channel-MOS transistors (output transistors) gmP1 and gmP2, two N-channel MOS transistors (input transistors) gmN1 and gmN2.

One input voltage VSin (i.e., the S input) is applied to the gate of the N-channel MOS transistor gmN1. The other input voltage VLin (i.e., the L input) is applied to the gate of the N-channel MOS transistor gmN2.

The gain G of the control section used in the voltage-controlled oscillator is expressed as follow:

$$G = gmN/gmP \quad (3)$$

where gmP is the conductance of each P-channel MOS transistor and gmN is the conductance of each N-channel MOS transistor.

As can be understood from Equation (3), the gain G can be changed by varying the conductance ratio between the P-channel MOS transistor and the N-channel MOS transistor. The conversion coefficients at the input terminals S and L are determined by changing the gain G, respectively.

Figure 10:
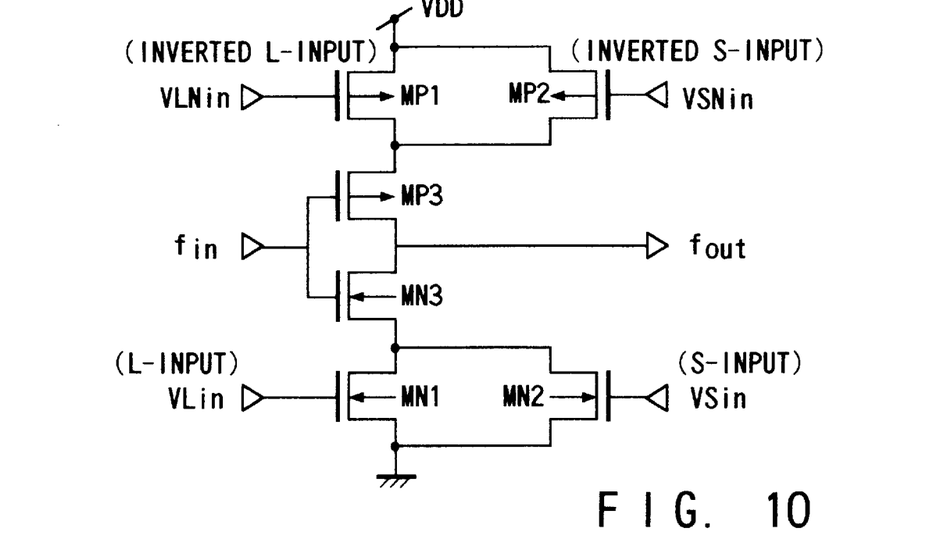
FIG. 10 is a circuit diagram showing an example of a ring-type voltage-controlled oscillator.

FIG. 10 shows an example of a ring-type voltage-controlled oscillator which has two input terminals. This oscillator comprises three P-channel MOS transistors MP1 to MP3 and three N-channel MOS transistors MN1 to MN3.

One input voltage VLin (i.e. the L input) is applied to the base of the N-channel MOS transistor MN1, and the other input voltage VSin (i.e. the S input) is applied to the base of the N-channel MOS transistor MN2. An input voltage VLNin (i.e., an inverted L input) is applied to the base of the P-channel MOS transistor MP1. An input voltage VSNin (i.e., an inverted S input) is applied to the base of the P-channel MOS transistor MP2.

In the ring-type voltage-controlled oscillator which has such delay cells, the conversion coefficients at the input terminals S and L can be changed by varying the size ratio (i.e., the ratios in gate length, gate width and the like) between the P-channel MOS transistor and the N-channel MOS transistor.

Figure 11:
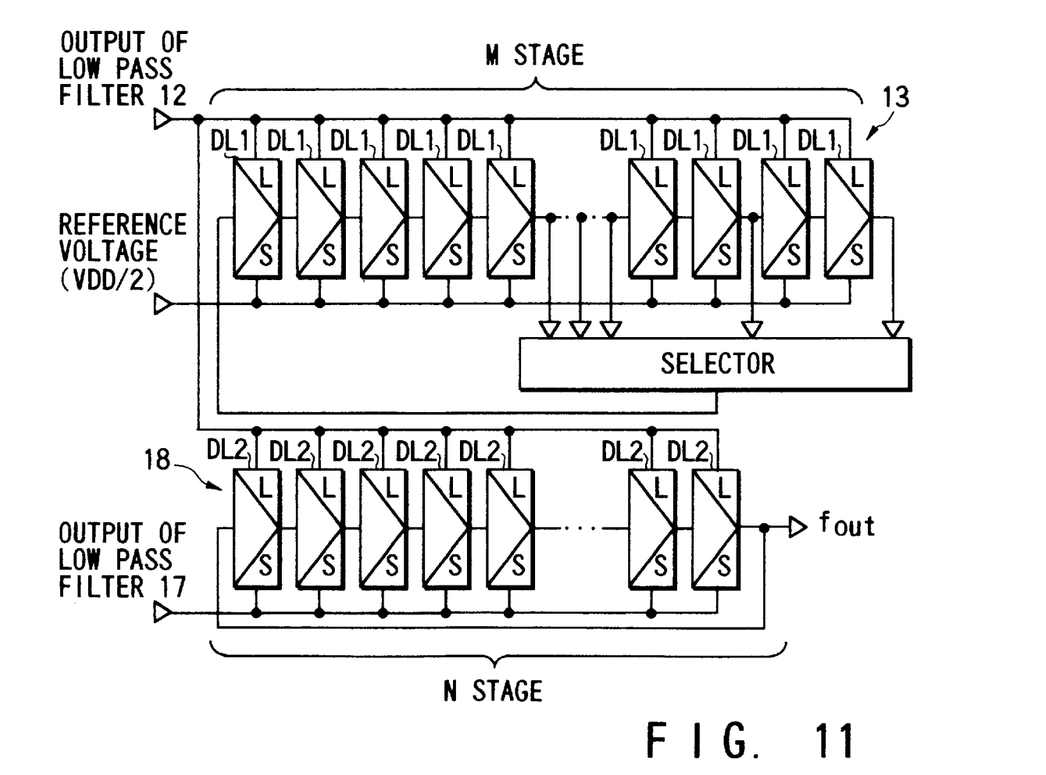
FIG. 11 is a circuit diagram illustrating an example of the voltage-controlled oscillator and an example of the voltage-controlled oscillator, both incorporated in the PLL system of FIG. 6.

FIG. 11 shows an example of the voltage-controlled oscillator 13 and an example of the voltage-controlled oscillator 18, both incorporated in the PLL system of FIG. 6.

In this embodiment, the conversion-coefficient ratio RK defined by Equation (2) can be changed by changing the number of delay cells DL1 used in the oscillator 13 and the number of delay cells DL2 used in the oscillator 18. Assuming that the delay cells DL1 and DL2 are identical in structure, the free-running frequency fout2 of the voltage-controlled oscillator 18 is given as follows:

$$\text{fout2} = \text{fxo} \times M/N \tag{4}$$

where M is the number of delay cells DL1, N is the number of delay cells DL2, and fxo is the reference frequency of the first PLL circuit.

As seen from Equation (4), the free-running frequency of the voltage controlled oscillator 18 is determined by the number of delay cells DL1 used in the oscillator 13 and the number of delay cells DL2 used in the oscillator 18.

Figure 12:
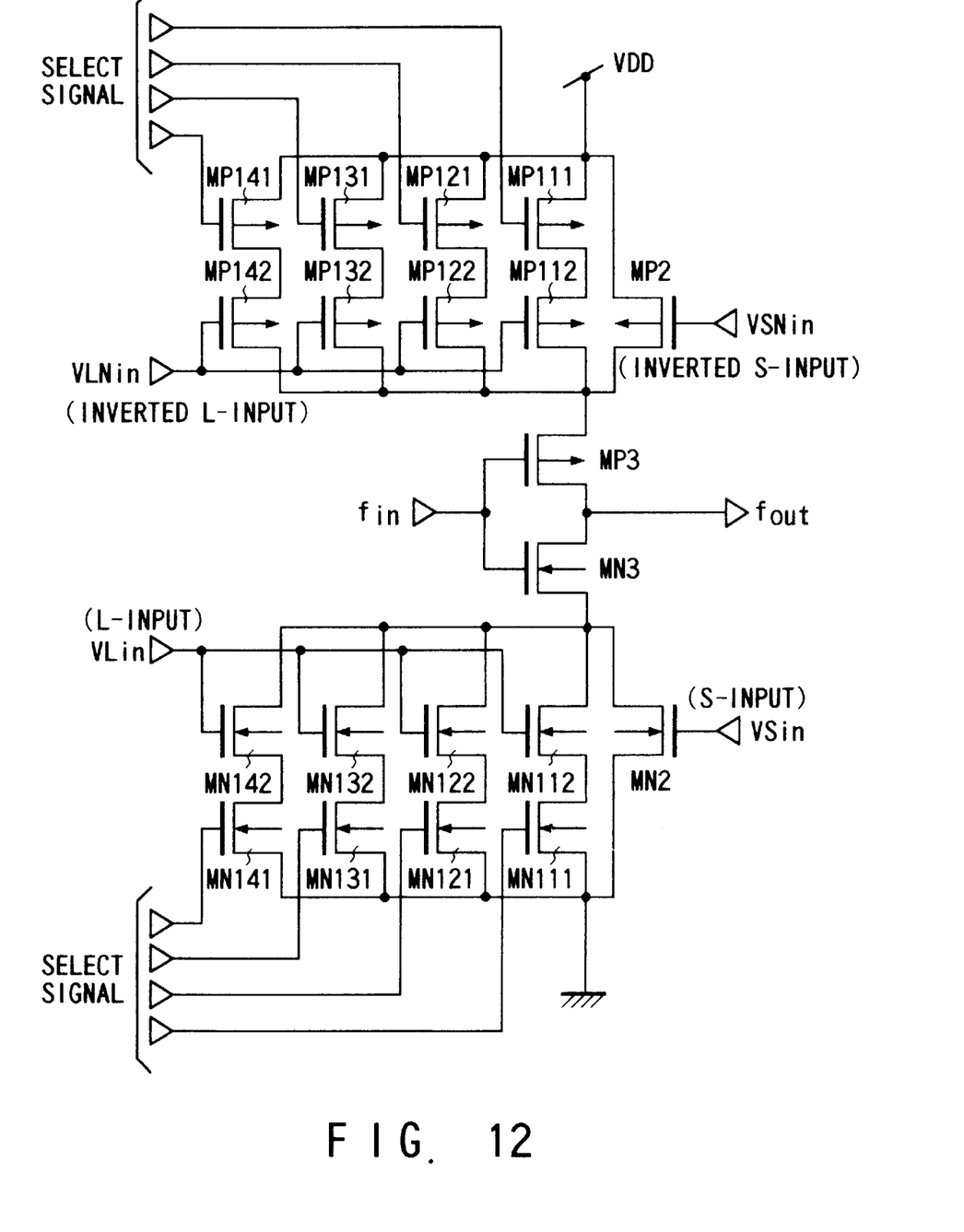
FIG. 12 is a circuit diagram showing one of the identical delay cells DL1 shown in FIG. 11.
Figure 13:
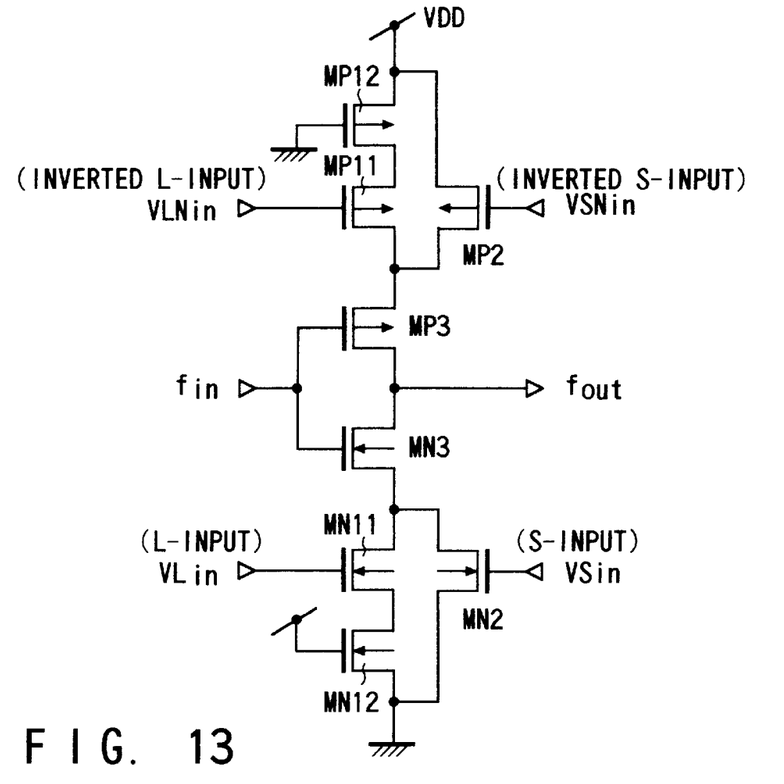
FIG. 13 is a circuit diagram showing one of the identical delay cells DL2 shown in FIG. 11.

FIG. 12 shows one of the identical delay cells DL1 incorporated in the voltage-controlled oscillator 13 shown in FIG. 11. FIG. 13 shows one of the identical delay cells DL2 used in the voltage-controlled oscillator 18 shown in FIG. 11. The conversion-coefficient ratio RK between the oscillators 13 and 18 can be changed by using delay cells of a specific size as the delay cells DL1 and delay cells of a different size as the delay cells DL2.

Assume that the voltage-controlled oscillators 13 and 18 have the same number of delay cells and that all these delay cells have the same channel length. Then, the free-running frequency fout2 of the voltage-controlled oscillator 18 is defined as follows:

$$\text{fout2} = \text{fxo} \times (WPR + WNR)/2$$

$$WPR = (WP1 + WP2)/(WP11 + WP12 + WP13 + WP14 + WP2)$$

$$WNR = (WN1 + WN2)/(WN11 + WN12 + WN13 + WN14 + WN2)$$

where WP1, WP2 and WP11 to WP14 are the channel widths of the MOS transistors MP1, MP2 and MP11 to MP14, and WN1, WN2 and WN11 to WN14 are the channel widths of the MOS transistor MN1, MN2 and MN11 to MN14.

The free-running frequency of the voltage-controlled oscillator 18 is determined by the size ratio of the transistors constituting the delay cells of the oscillator 13 to the transistors constituting the delay cells of the oscillator 18.

Figure 14:
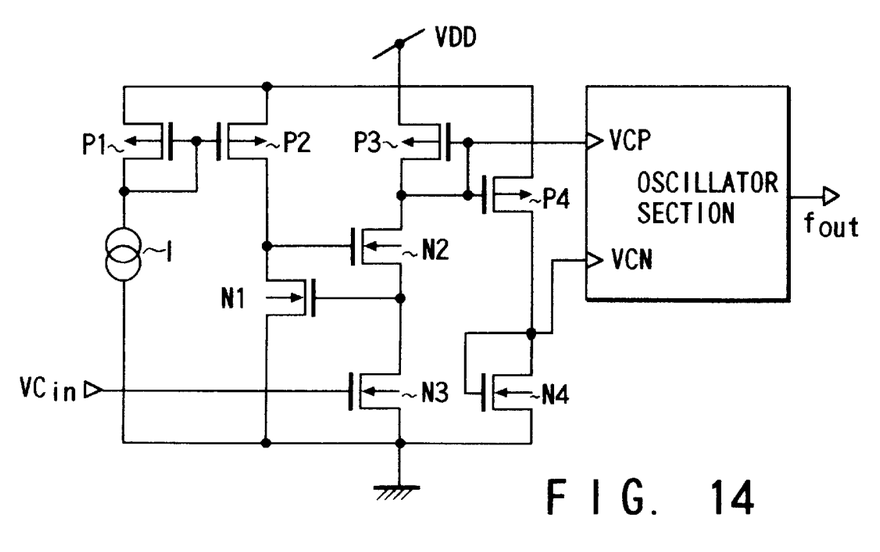
FIG. 14 is a circuit diagram illustrating an example of the control section for use in a voltage-controlled oscillator.

FIG. 14 illustrates an example of a control section for use in a voltage-controlled oscillator which has two input terminals This control section comprises four P-channel MOS transistors P1 to P4, four N-channel MOS transistors N1 to N4, and a constant current source I. A control voltage Cin is applied to the base of the N-channel MOS transistor N3.

Figure 15:
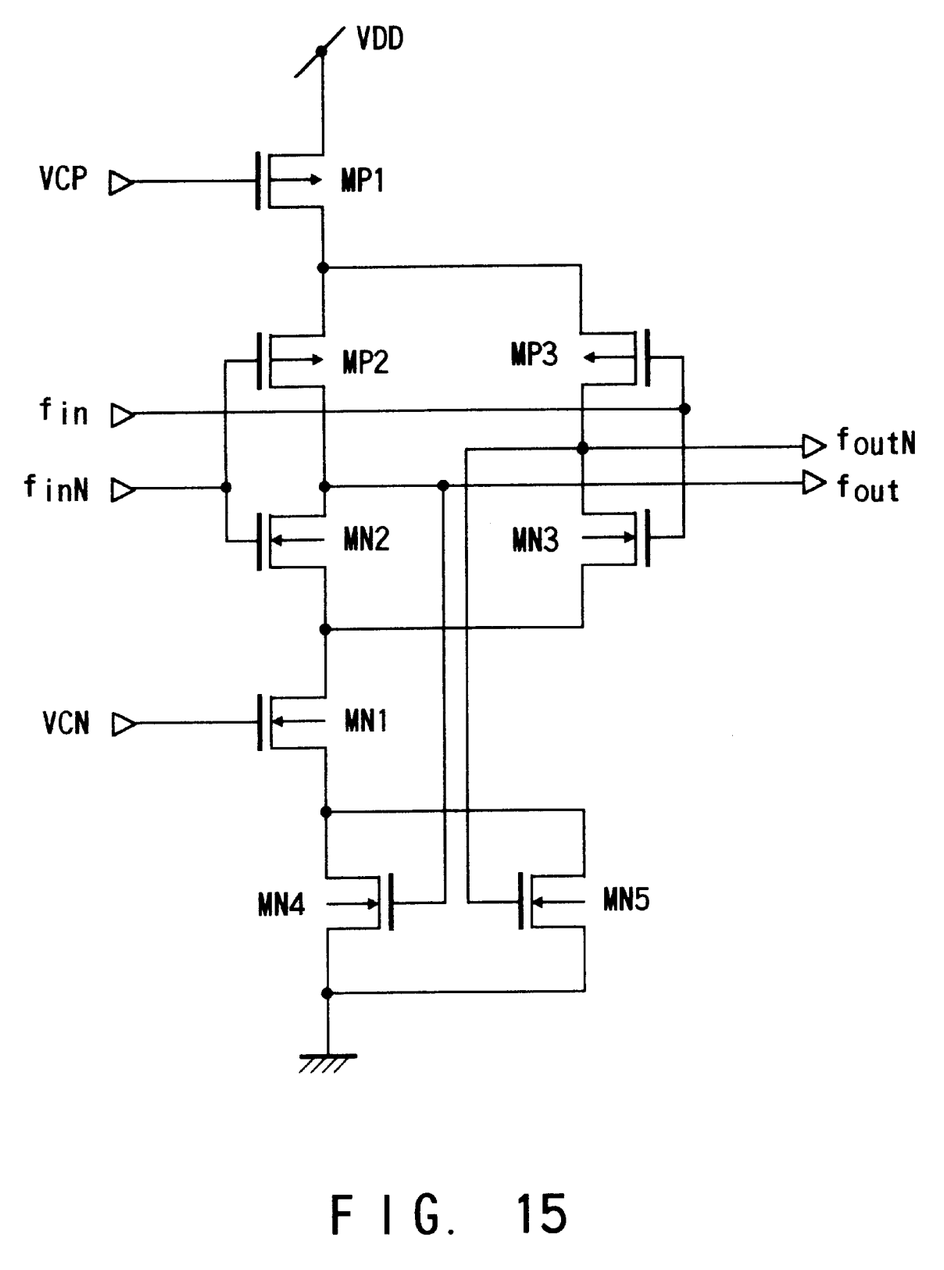
FIG. 15 is a circuit diagram showing one of the identical delay cells incorporated in a voltage-controlled oscillator.

FIG. 15 shows one of the identical delay cells incorporated in a ring-type voltage-controlled oscillator which has two input terminals. The delay cell comprises three P-channel MOS transistors MP1 to MP3 and five N-channel MOS transistors MN1 to MN5. The conversion-coefficient ratio RK of the voltage-controlled oscillator can be changed by altering the size of the MOS transistors MP1 to MP3 and MN1 to MN5.

In all embodiments described above, the ratios between the two oscillators in terms of resistance, the number of delay cells, the transistor size, and the like may be controlled, either dependently or independently.

With the PLL system according to the present invention it is possible to set an accurate free-running frequency, despite the process variation of the first PLL circuit 10A, the power-supply voltage thereof, the ambient temperature, or the like. The two PLL circuits constituting the PLL system can therefore have a minimum lock range. The narrower the lock range of each PLL circuit, the less noise influences the oscillator frequency of the PLL circuit. Thus, even if the multiplication ratio of each PLL circuit is increased several hundred times, both the phase error and the jitter can be reduced. The PLL system can therefore generate a low-jitter, highly stable frequency. Furthermore, despite its narrow lock range, each PLL circuit can generate a pulse signal having a broad-band frequency. Hence, the PLL system can be put to various uses.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A phase-locked loop system comprising:

a first voltage-controlled oscillator having first and second control input terminals; said first voltage controlled oscillator being configured to generate a first pulse signal having a first oscillating frequency;

a first divider receiving said first pulse signal and configured to divided said first pulse signal by an integer value to provide a first divided pulse signal;

a first phase detector configured to detect a phase difference between the first divided pulse signal and a first reference pulse signal to generate a first phase error indicating signal; and a first low-pass filter configured to integrate the first phase error indicating signal received from said first phase detector to provide an integrated control signal, wherein a first control signal is supplied to the first input control terminal to control a free-running frequency of said first voltage-controlled oscillator, the integrated control signal is supplied to the second control input terminal, and the first control signal is processed by a first conversion coefficient portion having a first conversion coefficient magnitude and the integrated control signal is processed by a second conversion coefficient portion having a second conversion coefficient magnitude smaller than the first conversion coefficient magnitude.

2. The phase-locked loop system according to claim 1, further comprising:

a second voltage-controlled oscillator having third and fourth control input terminals, said second voltage-controlled oscillator being configured to generate a second pulse signal having a second oscillation frequency;

a second divider receiving said second pulse signal and configured to divide said second pulse signal by an integer value to provide a second divided pulse signal;

a second phase detector configured to detect a phase difference between the second divided pulse signal and a second reference pulse signal and to generate a second phase error indicating signal; and a second low-pass filter configured to integrate the second phase indicating error signal to supply said first control signal, wherein the first control signal is also supplied to the third control input terminal, a reference voltage is applied to the fourth control input terminal, and the first control signal supplied to the third control input terminal is processed by a third conversion coefficient portion having a third conversion coefficient magnitude and the reference voltage applied to the fourth control input terminal is processed by a fourth conversion coefficient portion having a conversion coefficient magnitude smaller than the third conversion coefficient magnitude.

3. The phase-locked loop system according to claim 1, further comprising:

a second divider configured to receive a second reference signal and to divide said second reference signal by an integer value to produce a second divided pulse signal;

a second voltage-controlled oscillator having third and fourth control input terminals, said second voltage-controlled oscillator being configured to generate a second pulse signal having a second oscillation frequency;

a second phase detector configured to detect a phase difference between the second divided pulse signal and the second pulse signal and to generate a second phase error indicating signal; and a second low-pass filter configured to integrate the second phase error indicating signal to supply said first control signal, wherein the first control signal is also supplied to the third control input terminal, a reference voltage is applied to the fourth control terminal, and the first control signal supplied to the third control input terminal is processed by a third conversion coefficient portion having a third conversion coefficient magnitude and the reference voltage supplied to the fourth control input terminal is processed by a fourth conversion coefficient portion having a conversion coefficient magnitude smaller than the third conversion coefficient magnitude.

4. The phase-locked loop system according to claim 1, further comprising:

a second voltage-controlled oscillator having third and fourth control input terminals, said second voltage-controlled oscillator being configured to generate a second pulse signal having a second oscillation frequency;

a second phase detector configured to detect a phase difference between the second pulse signal and a second reference pulse signal and to generate a second phase error indicating signal; and a second low-pass filter configured to integrate the second phase error indicating signal, wherein the first control signal is also supplied to the third control input terminal, a reference voltage is applied to the fourth control input terminal, and the first control signal supplied to the third control input terminal is processed by a third conversion coefficient portion having a third conversion coefficient magnitude and the reference voltage applied to the fourth control input terminal is processed by a fourth conversion coefficient portion having a conversion coefficient magnitude smaller than the third conversion coefficient magnitude.

5. The phase-locked loop system according to claim 4, wherein a conversion coefficient ratio between said first voltage-controlled oscillator is changed to control a free-running frequency of said first voltage-controlled oscillator.

6. The phase-locked loop system according to claim 4, wherein said third and fourth coefficient conversion portions include respective input transistors and the second voltage-controlled oscillator includes an oscillator section connected by respective output transistors to said respective third and fourth coefficient conversion portions, and the third and fourth conversion coefficient magnitudes are respectively determined by a conductance ratio between respective input transistors and respective output transistors.

7. The phase-locked loop system according to claim 1, wherein said first voltage-controlled oscillator comprises a plurality of delay cells and the respective first and second conversion coefficient magnitudes are determined by size ratios of transistors which constitute said delay cells.

8. The phase-locked loop system according to claim 2, wherein said second voltage-controlled oscillator comprises a plurality of delay cells and the respective third and fourth conversion coefficient magnitudes are determined by size ratios of transistors which constitute said delay cells.

9. The phase-locked loop system according to claim 3, wherein said second voltage-controlled oscillator comprises a plurality of delay cells and the respective third and fourth conversion coefficient magnitudes are determined by size ratios of transistors which constitute said delay cells.

10. The phase-locked loop system according to claim 4, wherein said second voltage-controlled oscillator comprises a plurality of delay cells and the third and fourth conversion coefficient magnitudes are determined by size ratios of transistors which constitute said delay cells.

11. The phase-locked loop system according to claim 1 wherein said first voltage-controlled oscillator comprises a plurality of delay cells and the first and second conversion coefficient magnitudes are determined by the number of said delay cells.

12. A phase-locked loop system according to claim 4, wherein a free-running frequency of said first voltage-controlled oscillator is controlled by a ratio of the number of delay cells between said first voltage-controlled oscillator and said second voltage-controlled oscillator.

* * * * *